United States Patent
Huang et al.

(10) Patent No.: US 9,082,501 B2
(45) Date of Patent: Jul. 14, 2015

(54) SHIFT REGISTER APPARATUS AND DISPLAY SYSTEM UTILIZING THE SAME

(71) Applicant: INNOLUX CORPORATION, Chu-Nan, Miao-Li County (TW)

(72) Inventors: Sheng-Feng Huang, Chu-Nan (TW); Cheng-Hsiao Lin, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 304 days.

(21) Appl. No.: 13/794,342

(22) Filed: Mar. 11, 2013

(65) Prior Publication Data

US 2013/0249876 A1    Sep. 26, 2013

(30) Foreign Application Priority Data

Mar. 26, 2012 (TW) .............................. 101110319 A

(51) Int. Cl.
*G09G 3/36* (2006.01)
*G11C 19/28* (2006.01)

(52) U.S. Cl.
CPC ............ *G11C 19/287* (2013.01); *G09G 3/3674* (2013.01); *G09G 3/3685* (2013.01); *G11C 19/28* (2013.01); *G09G 2310/0286* (2013.01)

(58) Field of Classification Search
CPC .............. G09G 2310/0286; G09G 3/3674; G09G 3/3685; G11C 19/287; G11C 19/28
See application file for complete search history.

(56) References Cited

U.S. PATENT DOCUMENTS 5,990,857 A * 11/1999 Kubota et al. .................. 345/98
2009/0109161 A1  4/2009 Yamamoto et al.

FOREIGN PATENT DOCUMENTS

| TW | 200826054 | 6/2008 |
|---|---|---|
| TW | 201003182 | 1/2010 |
| TW | 201128651 | 8/2011 |
| TW | 201131536 | 9/2011 |
| TW | 201203217 | 1/2012 |

* cited by examiner

Primary Examiner — Abbas Abdulselam
(74) Attorney, Agent, or Firm — Liu & Liu

(57) ABSTRACT

A shift register apparatus including a first shift register cell is disclosed. The first shift register cell includes a first logic unit, a first control unit and a first output unit. The first logic unit generates a first control signal and a second control signal according to a start signal and a first setting signal. During a first period, the first control unit employs the first and second control signals to make a first clock signal update the first setting signal and the first output unit employs the first and second control signals to make a second clock signal update the first shifted signal. During a second period, the first output unit controls the first shifted signal according to the first and second control signals such that the first shifted signal does not follow the second clock signal.

14 Claims, 7 Drawing Sheets

US 9,082,501 B2

SHIFT REGISTER APPARATUS AND DISPLAY SYSTEM UTILIZING THE SAME

CROSS REFERENCE TO RELATED APPLICATIONS

This Application claims priority of Taiwan Patent Application No. 101110319, filed on Mar. 26, 2012, the entirety of which is incorporated by reference herein.

BACKGROUND OF THE INVENTION

1. Field of the Invention

The invention relates to a shift register apparatus, and more particularly to a shift register apparatus which is capable of reducing parasitic capacitance.

2. Description of the Related Art

A shift register apparatus is a common circuit structure. The shift register apparatus transforms series data into parallel data, and as such the shift register is generally applied in a display device. Taking a liquid crystal display device as an example, the parallel data generated by the shift register apparatus is utilized to assert a plurality of scan lines.

BRIEF SUMMARY OF THE INVENTION

In accordance with an embodiment, a shift register apparatus comprises a plurality of shift registers. Each shift register comprises a first shift register cell. The first shift register cell which are serially connected, each of the shift register cell having an input terminal connected to an output terminal of a preceding shift register cell and an output terminal connected to an input terminal of a succeeding shift register cell, comprises a first logic unit, a first control unit and a first output unit. The first logic unit generates a first control signal and a second control signal according to a start signal from the input terminal and a first setting signal. The first control unit employs the first and second control signals to make a first clock signal from the input terminal update the first setting signal during a first period. The first output unit outputs a first shifted output signal to the output terminal. During the first period, the first output unit employs the first and second control signals to make a second clock signal from the input terminal update the first shifted output signal. During the second period, the first output unit controls the first shifted output signal according to the first and second control signals such that the first shifted output signal does not follow the second clock signal.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
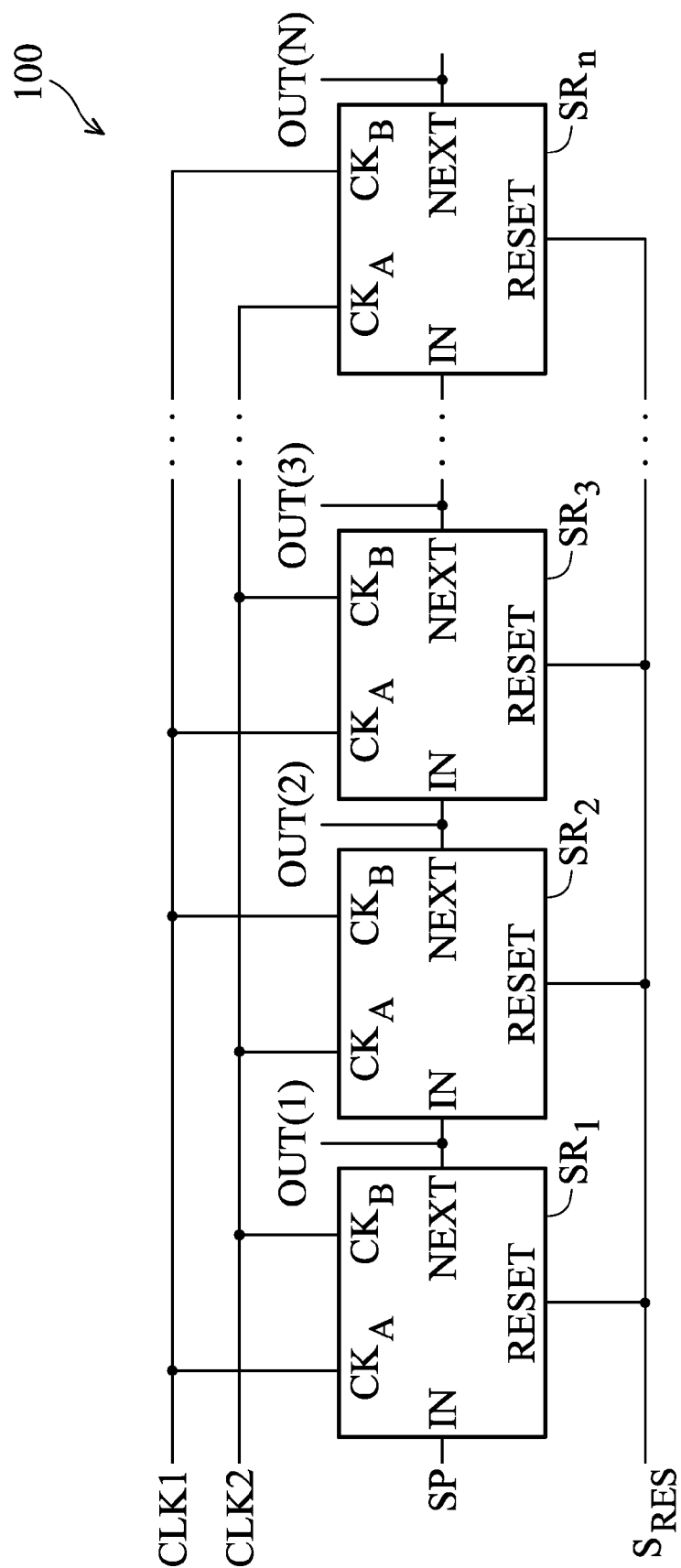
FIG. 1 is a schematic diagram of an exemplary embodiment of a shift register apparatus

FIG. 1 is a schematic diagram of an exemplary embodiment of a shift register apparatus. The shift register apparatus comprises a plurality of shift registers 100. Each shift register 100 comprises a plurality of shift register cells $SR_1 \sim SR_n$. Each of the shift register cells $SR_1 \sim SR_n$ comprises an input terminal and an output terminal. The input terminal comprises a signal input terminal IN, clock input terminals $CK_A$, $CK_B$ and a reset terminal RESET. The output terminal is a signal output terminal NEXT. In this embodiment, each of the shift register cells $SR_1 \sim SR_n$ generates a corresponding shifted output signal according to the signals received by the signal input terminal IN, and the clock input terminals $CK_A$ and $CK_B$. For example, the shift register cells $SR_1 \sim SR_n$ generate shifted output signals OUT(1)~OUT(N).

Each signal input terminal IN is coupled to the signal output terminal NEXT of a previous shift register cell. For example, the signal input IN of the shift register cell $SR_2$ is coupled to the signal output terminal NEXT of the shift register cell $SR_1$. In this embodiment, the signal input terminal IN of the shift register cell $SR_1$ receives a start signal SP.

Each signal output terminal NEXT provides a shifted output signal to the signal input terminal IN of a next shift register cell. For example, the signal output terminal of the shift register cell $SR_1$ provides the shifted output signal OUT(1) to the signal input terminal IN of the shift register cell $SR_2$. The signal output terminal NEXT of the shift register cell $SR_2$ provides the shifted output signal OUT(2) to the signal input terminal IN of the shift register cell $SR_3$.

In one embodiment, the shift register 100 may be applied in a gate driver of a display system. The gate driver generates a plurality of scan signals to successively assert scan lines, but the disclosure is not limited thereto. In other embodiments, the shift register 100 may be applied to other electronic products.

The clock input terminal $CK_A$ receive one of the clock signals CLK1 and CLK2. The clock input terminal $CK_B$ receives another of the clock signals CLK1 and CLK2. In this embodiment, the clock input terminals $CK_A$ of odd shift register cells (e.g. $SR_1$, $SR_3$) receive the clock signal CLK1, the clock input terminals $CK_B$ of the odd shift register cells receive the clock signal CLK2, the clock input terminals $CK_A$ of even shift register cells (e.g. $SR_2$, $SR_4$) receive the clock signal CLK2, and the clock input terminals $CK_B$ of the even shift register cells (e.g. $SR_2$, $SR_4$) receive the clock signal CLK1.

The reset terminal RESET receives a reset signal $S_{RES}$ to reset the signal of the signal output terminal RESET. In one embodiment, the signal of the signal output terminal NEXT is reset to a low level, but the disclosure is not limited thereto. In other embodiments, the signal of the signal output terminal NEXT is reset to a high level.

Figure 2:
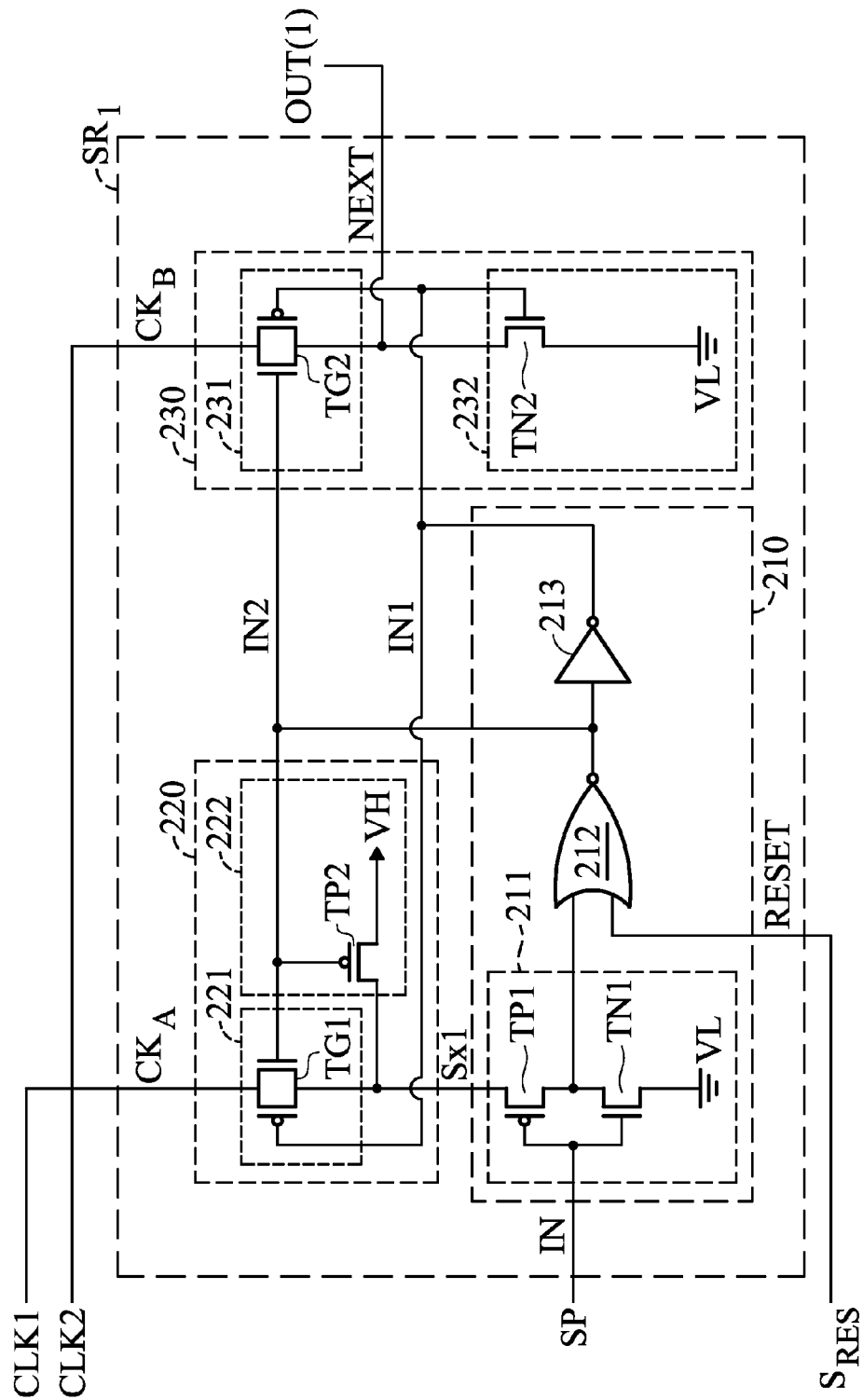
FIGS. 2 and 3 are schematic diagrams of other exemplary embodiments of the shift register cells.
Figure 3:
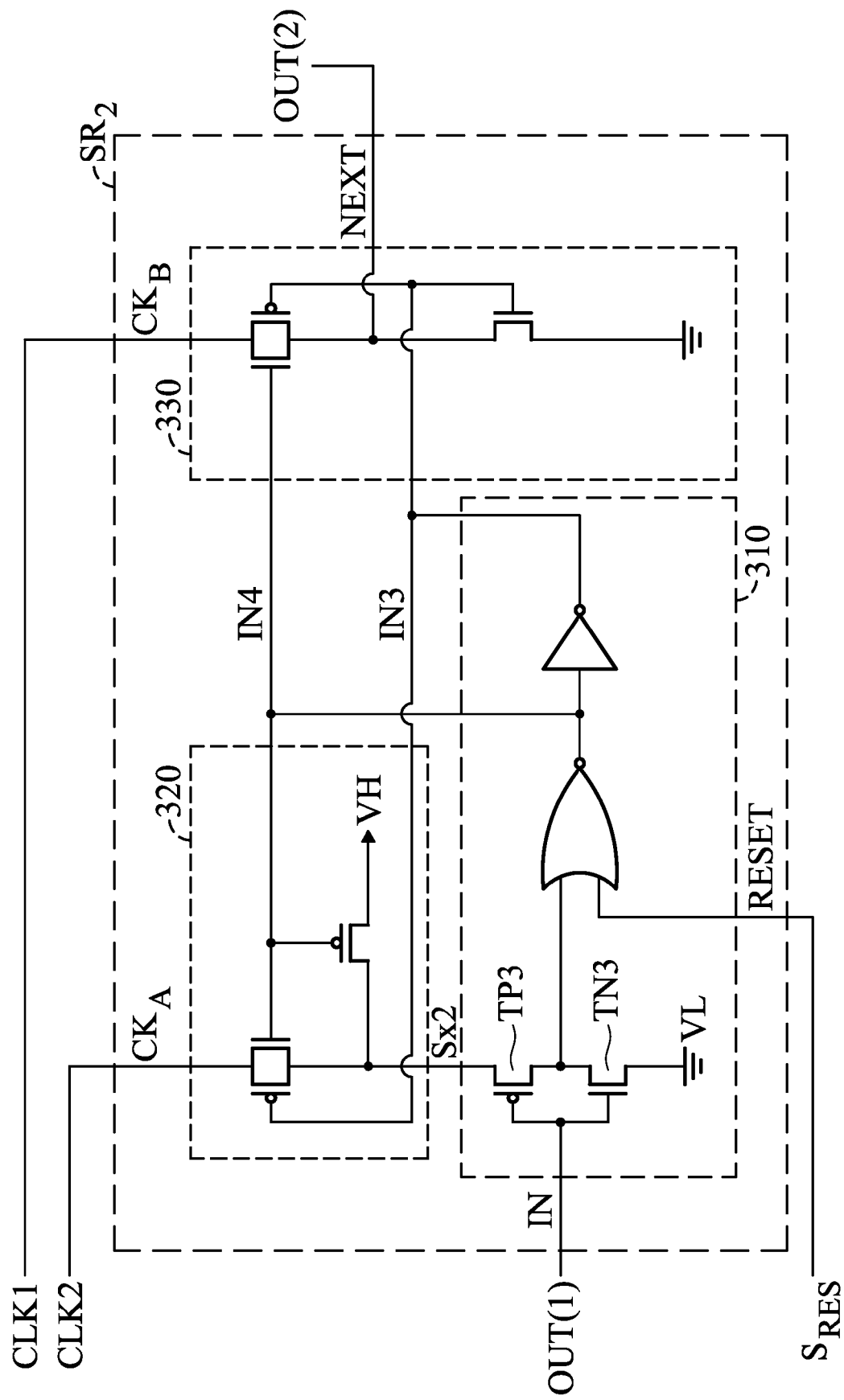

FIGS. 2 and 3 are schematic diagrams of other exemplary embodiments of the shift register cells. Since the circuit structures of the shift register cells are the same, only shift register cells $SR_1$ and $SR_2$ are shown in FIGS. 2 and 3. Refer to FIG. 2, the shift register cell $SR_1$ comprises a logic unit 210, a control unit 220 and an output unit 230.

The logic unit 210 generates control signals IN1 and IN2 according to a start signal SP and a setting signal Sx1. The control unit 220 generates the setting signal Sx1 according to the control signals IN1 and IN2. The output unit 230 generates the shifted output signal OUT(1) according to the control signals IN1 and IN2.

In this embodiment, the control unit 220 serves the clock signal CLK1 as the setting signal Sx1 during a first period. During the first period, the logic unit 210 sets the control signal IN1 to a low level connecting to the lower voltage and sets the control signal IN2 to a high level connecting to the higher voltage. Thus, the output unit 230 employs the control signals IN1 and IN2 to make the shifted output signal OUT(1) equal to the clock signal CLK2.

During a second period, the logic unit 210 sets the control signal IN1 to the high level and sets the control signal IN2 to the low level. Thus, the output unit 230 controls the shifted output signal OUT(1) according to the control signals IN1 and IN2 such that the shifted output signal OUT(1) is not equal to the clock signal CLK2.

As shown in FIG. 2, the logic unit 210 comprises logic gates 211~213. In this embodiment, the logic gate 211 is a NOT gate, the logic gate 212 is a NOR gate and the logic gate 213 is a NOT gate, but the disclosure is not limited thereto. Any logic circuit can serve as the logic unit 210, as long as the logic circuit is capable of actualizing the functions of the logic unit 210.

As shown in FIG. 2, the logic gate 211 comprises transistors TP1 and TN1. The transistor TP1 comprises a gate receiving the start signal SP, a drain and a source. One of the drain and the source of the transistor TP1 receives the setting signal Sx1. In this embodiment, the transistor TP1 is a P-type transistor. Thus, the source of the P-type transistor receives the setting signal Sx1. The transistor TN1 is connected to the transistor TP1 in series. The gate of the transistor TN1 receives the start signal SP. The drain of the transistor TN1 is coupled to the drain of the transistor TP1. The source of the transistor TN1 receives a low reference level VL connecting to the lower voltage.

In this embodiment, the logic gate 211 comprises two transistors to selectively output the setting signal Sx1 or the level reference level VL according to the start signal SP, but the disclosure is not limited thereto. In other embodiments, any logic gate can serve as the logic gate 211, as long as the logic gate is capable of outputting one of the setting signal Sx1 and the low reference level.

Refer to FIG. 2, the logic gate 212 is a NOR gate and coupled to the transistor TP1 to receive the output of the logic gate 211. Additionally, the logic gate 212 further receives a reset signal $S_{RES}$. The logic gate 212 generates the control signal IN2 according to the output of the logic gate 211 and the reset signal $S_{RES}$. The logic gate 213 is coupled to the logic gate 212 to generate the control signal IN1. In this embodiment, the logic gate 213 is a NOT gate.

The control unit 220 comprises a switch 221 and a level unit 222. The switch 221 serves the clock signal CLK1 as the setting signal Sx1 according to the control signals IN1 and IN2. For example, when the control signal IN1 is at a low level and the control signal IN2 is at a high level, the switch 211 serves the clock signal CLK1 as the setting signal Sx1. In this embodiment, the switch 221 is a transmission gate TG1, but the disclosure is not limited thereto. In other embodiments, the switch 221 is an N-type or a P-type transistor.

The level unit 222 sets the level of the setting signal Sx1 according to the control signal IN2. For example, when the control signal IN2 is at the low level, the level unit 222 sets the level of the setting signal Sx1 to a high reference level VH connecting to a higher voltage. In this embodiment, the level unit 222 is a P-type transistor TP2. The P-type transistor TP2 comprises a gate receiving the control signal IN2, a source receiving the high reference level VH and a drain coupled to the transistor TP1.

The output unit 230 comprises a switch 231 and a level unit 232. The switch 231 serves the clock signal CLK2 as the shifted output signal OUT(1) according to the control signals IN1 and IN2. For example, when the control signal IN1 is at the low level and the control signal IN2 is at the high level, the switch 231 makes the clock signal CLK2 update the level of the shifted output signal OUT(1). In this embodiment, the level of the shifted output signal OUT(1) is equal to the level of the clock signal CLK2. In other words, the shifted output signal OUT(1) follows the clock signal CLK2. In this embodiment, the switch 231 is a transmission gate TG2, but the disclosure is not limited thereto. In other embodiments, the switch 231 is an N-type or a P-type transistor.

The level unit 232 sets the level of the shifted output signal OUT(1) according to the control signal IN1. For example, when the control signal IN1 is at the high level, the level unit 232 sets the shifted output signal OUT(1) to a low reference level VL. In this embodiment, the level unit 232 is an N-type transistor TN2. The N-type transistor TN2 comprises a gate receiving the control signal IN1, a drain coupled to the switch 231 and a source receiving the low reference level VL.

As shown in FIG. 3, the shift register cell $SR_2$ comprises a logic unit 310, a control unit 320 and an output unit 330. The logic unit 310 generates control signals IN3 and IN4 according to the shifted output signal OUT(1) and a setting signal Sx2. In this embodiment, the shifted output signal OUT(1) received by the logic unit 310 is the same as the shifted output signal OUT(1) shown in FIG. 2. The control unit 320 generates the setting signal Sx2 according to the control signals IN3 and IN4. The output unit 330 generates a shifted output signal OUT(2) according to the control signals IN3 and IN4.

In this embodiment, the control unit 320 serves the clock signal CLK2 as the setting signal Sx2 during a third period. At this time, the logic unit 310 sets the level of the control signal IN3 to a low level and sets the level of the control signal IN4 to a high level. Thus, the output unit 330 controls the shifted output signal OUT(2) to equal to the clock signal CLK1.

In FIG. 2, the clock terminal $CLK_A$ receives the clock signal CLK1 and the clock terminal $CLK_B$ receives the clock signal CLK2. In FIG. 3, the clock terminal $CLK_A$ receives the clock signal CLK2 and the clock terminal $CLK_B$ receives the clock signal CLK1. Additionally, the signal input terminal IN receives the start signal SP in FIG. 2 and the signal input terminal IN receives the shifted output signal OUT(1) in FIG. 3. Since the logic unit 310, the control unit 320 and the output unit 330 in FIG. 3 are the same as the logic unit 210, the control unit 220 and the output unit 230 in FIG. 2, the descriptions of the logic unit 310, the control unit 320 and the output unit 330 are omitted for brevity.

Figure 4:
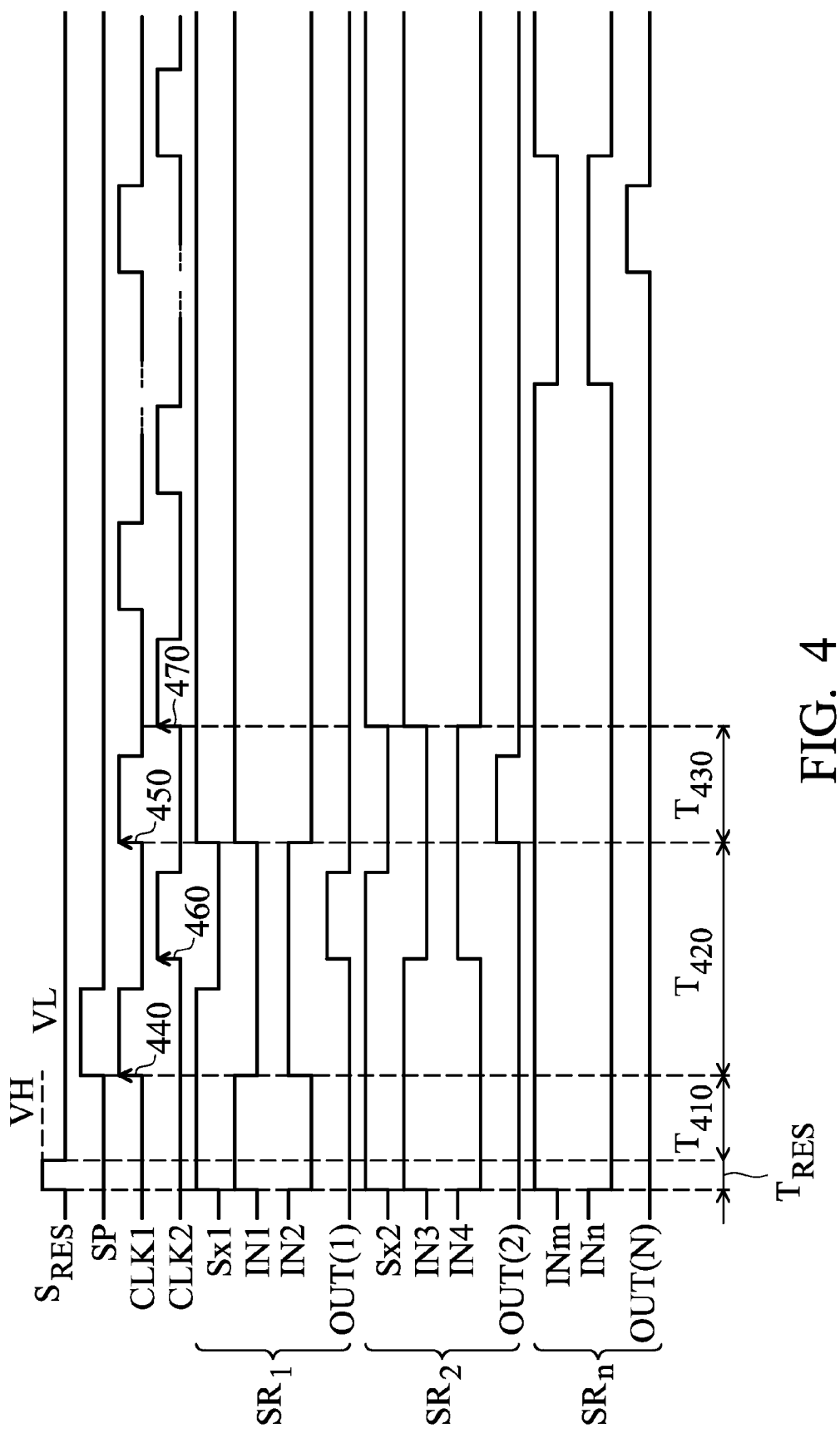
FIG. 4 is a timing diagram of an exemplary embodiment of shift register cells.

FIG. 4 is a timing diagram of an exemplary embodiment of shift register cells. Since the control methods for the shift register cells $SR_1$~SRn are the same, the shift register cell $SR_1$ is given as an example to describe the control method. Refer to FIG. 2, during a reset period $T_{RES}$, the reset signal $S_{RES}$ is at a high level to reset the shift register cells $SR_1$~$SR_n$. Thus, the control signals IN1~IN4, INm, Inn, the shifted output signals OUT(1)~OUT(N) are reset at a corresponding reset level. For example, the control signal IN1 is reset to a high level and the control signal IN2 is reset to a low level.

Since the reset level of the control signal IN1 is the high level and the reset level of the control signal IN2 is the low level, the level unit 222 sets the setting signal Sx1 to the high level. During the period $T_{410}$, the start signal SP is at a low level to turn on the transistor TP1. Thus, the logic gate 212 receives a high level such that the control signal IN1 is at a high level and the control signal IN2 is at a low level. At this time, the control signal IN1 turns on the level unit 232. Thus, the shifted output signal OUT(1) is at a low level.

During the period $T_{420}$, since the start signal SP is at the high level, the transistor TN1 is turned on. Thus, the logic gate 211 outputs a low level. Since the reset signal $S_{RES}$ is at a low level, the control signal IN1 is at the low level and the control signal IN2 is at the high level. Thus, the switches 221 and 231 are turned on. At this time, the clock signal CLK1 updates the setting signal Sx1 and the clock signal CLK2 updates the shifted output signal OUT(1). In one embodiment, the setting signal Sx1 follows the clock signal CLK1 and the shifted output signal OUT(1) follows the clock signal CLK2.

Refer to FIG. 3, when the shifted output signal OUT(1) is at the high level, the transistor TN3 is turned on. Thus, the control signal IN3 is at the low level and the control signal IN4 is at the high level during the period $T_{430}$. At this time, the clock signal CLK1 updates the setting signal Sx2 and the shifted output signal OUT(2). In one embodiment, the setting signal Sx2 and the shifted output signal OUT(2) follow the clock signal CLK1.

However, the control signal IN1 is at the high level and the control signal IN2 is at the low level during the period $T_{430}$. Thus, the switches 221 and 231 are turned off such that the clock signal CLK1 does not update the setting signal Sx1 and the clock signal CLK2 does not update the shifted output signal OUT(1). In one embodiment, the setting signal Sx1 does not follow the clock signal CLK1 and the shifted output signal OUT(1) does not follow the clock signal CLK2. Thus, the setting signal Sx1 does not equal to the clock signal CLK1. At this time, the setting signal Sx1 is equal to the high reference level VH. In this embodiment, the level unit 232 is turned on during the period $T_{430}$. Thus, the shifted output signal OUT(1) is equal to the low reference level VL.

In this embodiment, the raise edge 440 of the clock signal CLK1 activates the shift register cell $SR_1$ such that the clock signal CLK2 updates the shifted output signal OUT(1). In one embodiment, the shifted output signal OUT(1) follows the clock signal CLK2. Additionally, the raise edge 450 of the clock signal CLK1 de-activates the shifted register cell $SR_1$ such that the clock signal CLK2 does not update the shifted output signal OUT(1). In one embodiment, the shifted output signal OUT(1) does not follow the clock signal CLK2. In other words, the shifted output signal OUT(1) is not equal to the clock signal CLK2.

Similarly, the raise edge 460 of the clock signal CLK2 activates the shifted register cell $SR_2$ such that the clock signal CLK1 updates the shifted output signal OUT(2). In one embodiment, the shifted output signal OUT(2) follows the clock signal CLK1. Additionally, the raise edge 470 of the clock signal CLK2 de-activates the shift register cell $SR_2$ such that the clock signal CLK1 does not update the shifted output signal OUT(2). In one embodiment, the shifted output signal OUT(2) does not follow the clock signal CLK1. In other words, the shifted output signal OUT(2) is not equal to the clock signal CLK1.

Since the clock signals CLK1 and CLK2 appropriately update the shifted output signals OUT(1)~OUT(N), a shift effect occurs between the shifted output signals OUT(1)~OUT(N). In one embodiment, the clock signals CLK1 and CLK2 are complementary signals. In other words, the frequency of the clock signal CLK1 is the same as the frequency of the clock signal CLK2, but the level of the clock signal CLK1 is inverted to the level of the clock signal CLK2. In this embodiment, the frequency of the clock signal CLK1 is the same as the frequency of the clock signal CLK2, and the level of the clock signal CLK1 may be inverted to or the same as the level of the clock signal CLK2. Refer to FIG. 4, when the clock signal CLK1 is at a low level, the clock signal CLK2 may be at the low level.

Additionally, the control signals IN1~IN4 can set the levels of the setting signals Sx1 and Sx2 in this embodiment. For example, the level of the setting signal Sx1 may be equal to the clock signal CLK1 or the high reference level VH according to the control signals IN1 and IN2. Thus, the setting signal Sx1 does not relate to the shifted output signal OUT(1), and the setting signal Sx2 does not relate to the shifted output signal OUT(2). In other words, the setting signals Sx1 and Sx2 are not affected by the shifted output signal OUT(1) or OUT(2).

Figure 5:
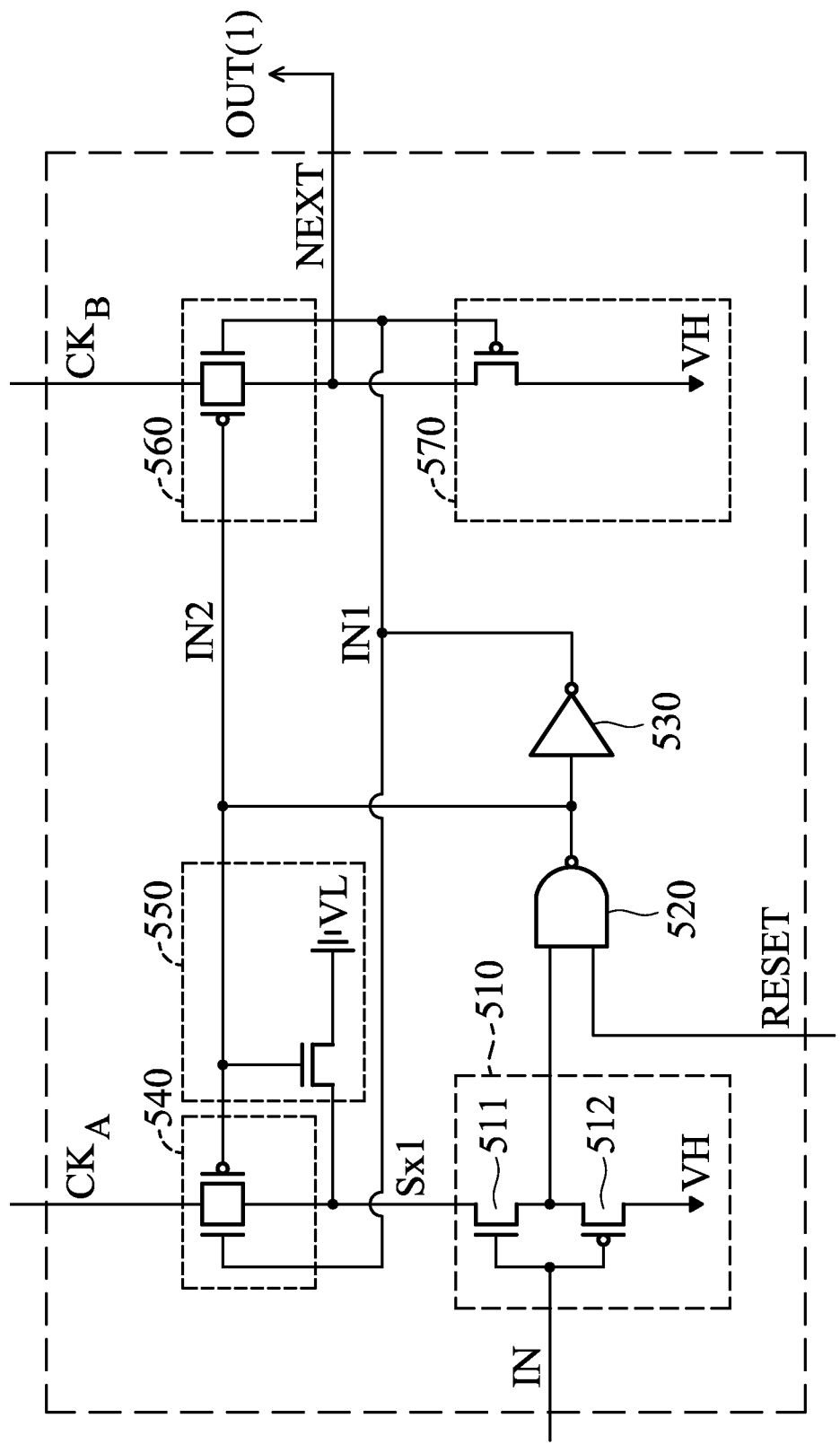
FIG. 5 is a schematic diagram of another exemplary embodiment of a shift register cell.

FIG. 5 is a schematic diagram of another exemplary embodiment of a shift register cell. For clarity, only one shift register cell is shown. FIG. 5 is similar to FIG. 2 except for the types of the transistors and the logic gate 510.

In this embodiment, the logic gate 510 comprises transistors 511 and 512. The transistor 511 is an N-type transistor, thus, the source of the transistor 511 receives the setting signal Sx1. The transistor 512 is a P-type transistor. Additionally, the logic gate 520 is a NAND gate, and the logic gate 530 is a NOT gate. Switches 540 and 560 are transmission gates, but the disclosure is not limited thereto. In other embodiments, at least one of the switches 540 and 560 is an N-type or a P-type transistor.

The level unit 550 sets the level of the setting signal Sx1 to a low level, such as the low reference level VL. The level unit 570 sets the shifted output signal OUT(1) to a high level, such as the high reference level VH. In this embodiment, the level unit 550 is an N-type transistor. The gate of the N-type transistor receives the control signal IN2. The source of the N-type transistor receives a low reference level VL. The drain of the N-type transistor is coupled to the switch 540. The level unit 570 is a P-type transistor. The gate of the P-type transistor receives the control signal IN1. The drain of the P-type transistor is coupled to the switch 560. The source of the P-type transistor receives a high reference level VH.

Figure 6:
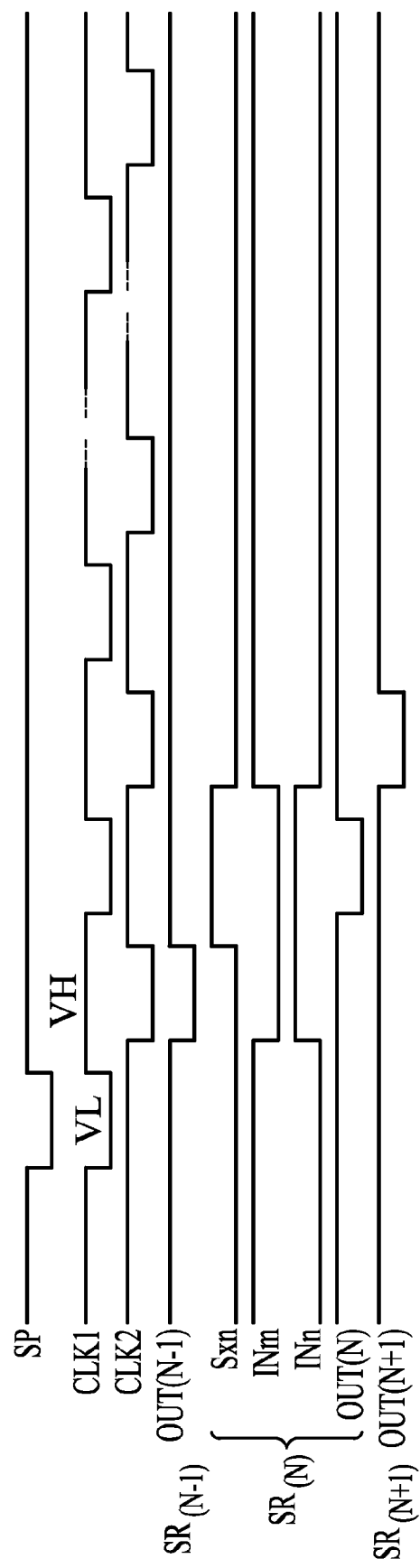
FIG. 6 is a timing diagram of another exemplary embodiment for controlling the shift register cell.

FIG. 6 is a timing diagram of another exemplary embodiment for controlling the shift register cell. When the circuit structure of a shift register cell is the same as the shift register cell shown in FIG. 5, another control method is utilized. The control method shown in FIG. 6 is contrary to the control method shown in FIG. 4. FIG. 6 shows the shifted output signal OUT(N−1), OUT(N) and OUT(N+1) generated by the (N−1)th shift register cell, the (N)th shift register cell and the (N+1)th shift register cell. Since FIGS. 4 and 6 have the same principle, description of FIG. 6 is omitted for brevity.

Figure 7:
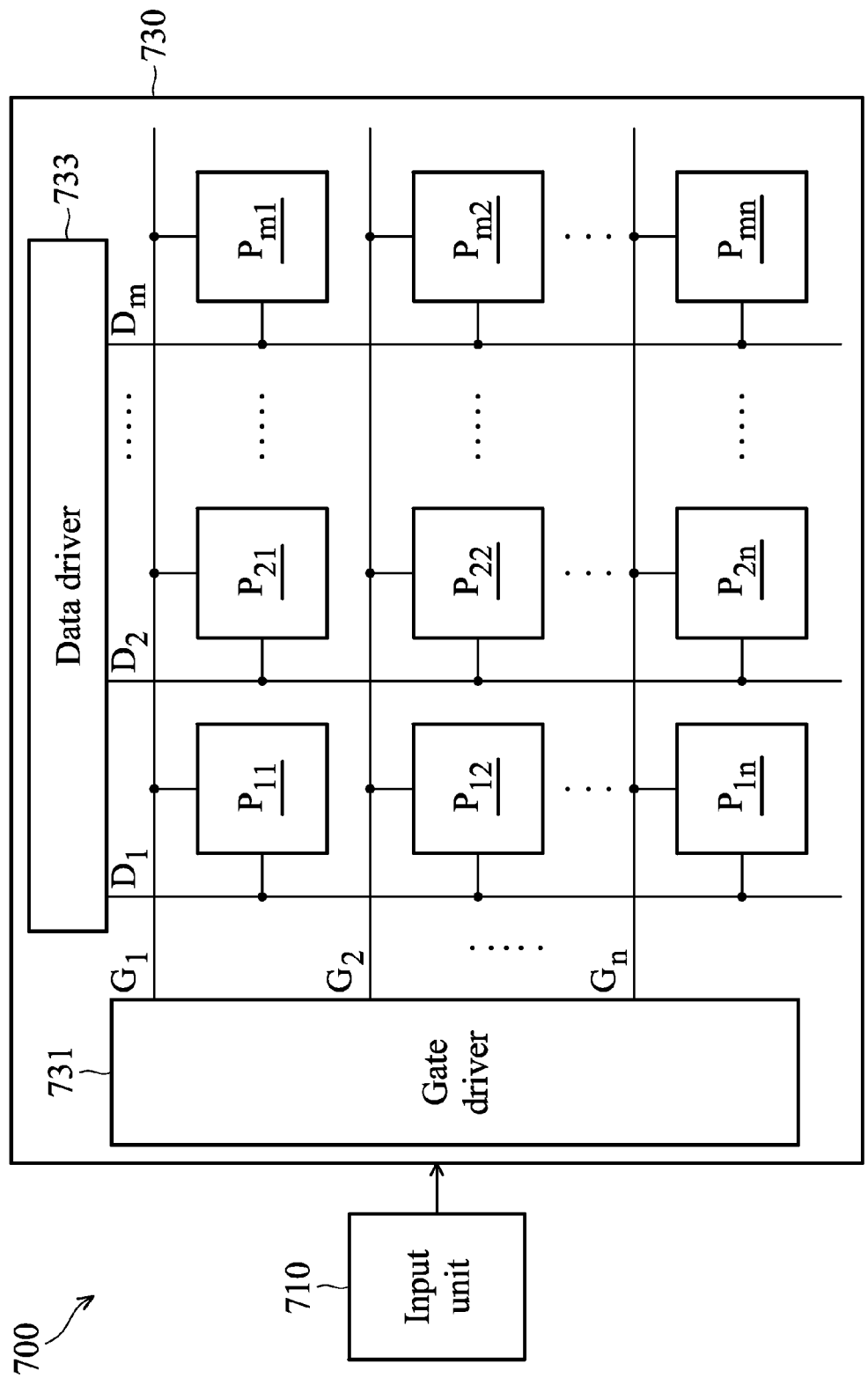
FIG. 7 is a schematic diagram of an exemplary embodiment of a display system.

FIG. 7 is a schematic diagram of an exemplary embodiment of a display system. The display system 700 applies the shift register apparatus. The invention does not limit the kind of display system 700. For example, the display system 700 is a tablet personal computer, a projector, an electronic book, a notebook computer (NB), a cellular phone, a digital camera (DSC), a personal digital assistant (PDA), a personal computer (PC), a television, a car display, a mobile DVD player or another image display device.

In this embodiment, the display system 700 comprises an input unit 710 and a display panel 730. The input unit 710 is coupled to the display panel 730 to provide an input signal to the display panel 730 such that the display panel 730 displays an image.

The display panel 730 comprises a gate driver 731, a data driver 733 and pixels $P_{11}$~$P_{mn}$. The gate driver 731 generates gate signals $G_1$~$G_n$ to drive the pixels $P_{11}$~$P_{mn}$. In one embodiment, the gate driver 731 comprises a shift register apparatus shown in FIG. 1 to generate the gate signals $G_1 \sim G_n$, but the disclosure is not limited thereto. In other embodiments, the gate driver 731 further comprises a level shifter to transform the output signals of the shift register apparatus and serves the transformed signals as the gate signals $G_1 \sim G_n$. The data driver 733 generates data signals $D_1 \sim D_m$ to drive the pixels $P_{11} \sim P_{mn}$. The pixels $P_{11} \sim P_{mn}$ receive the data signals $D_1 \sim D_m$ according to the gate signals $G_1 \sim G_n$ and then display the image according to the data signal $D_1 \sim D_m$.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded with the broadest interpretation so as to encompass all such modifications and similar arrangements.

What is claimed is:

1. A shift register apparatus, comprising:
   a plurality of shift registers, each shift register comprising:
      a first shift register cell, which are serially connected, each of the shift register cell having an input terminal connected to an output terminal of a preceding shift register cell and an output terminal connected to an input terminal of a succeeding shift register cell, comprising:
         a first logic unit generating a first control signal and a second control signal according to a start signal from the input terminal and a first setting signal;
         a first control unit according to the first and second control signals to make a first clock signal from the input terminal update the first setting signal during a first period; and
         a first output unit outputting a first shifted output signal to the output terminal, wherein during the first period, the first output unit employs the first and second control signals to make a second clock signal from the input terminal update the first shifted output signal, and during the second period, the first output unit controls the first shifted output signal according to the first and second control signals such that the first shifted output signal does not follow the second clock signal.

2. The shift register apparatus as claimed in claim 1, wherein when the first clock signal is at a high level, the second clock signal is at a low level, and when the first clock signal is at the low level, the second clock signal is at the high level.

3. The shift register apparatus as claimed in claim 1, wherein the first setting signal does not relate to the first shifted output signal.

4. The shift register apparatus as claimed in claim 1, wherein the first logic unit comprises a first logic gate comprising a first transistor comprising a gate, a drain and a source, and
   wherein the gate receives the start signal, the drain or the source receives the first setting signal.

5. The shift register apparatus as claimed in claim 4, wherein the first logic gate further comprises:
   a second transistor connected to the first transistor and comprising a gate receiving the start signal.

6. The shift register apparatus as claimed in claim 5, wherein the first logic unit further comprises:
   a second logic gate coupled to the first transistor to generate the second control signal; and
   a third logic gate coupled to the second logic gate to generate the first control signal.

7. The shift register apparatus as claimed in claim 6, wherein the first control unit comprises:
   a first switch serving the first clock signal to the first setting signal; and
   a first level unit setting a level of the first setting signal, wherein the first output unit comprises:
   a second switch serving the second clock signal to the first shifted output signal; and
   a second level unit setting a level of the first shifted output signal.

8. The shift register apparatus as claimed in claim 7, wherein the first transistor is a P-type transistor, the second transistor is an N-type transistor, the second logic gate is a NOR gate, the third logic gate is a NOT gate, at least one of the first and the second switches is a transmission gate, an N-type transistor or a P-type transistor, the first level unit sets the level of the first setting signal to a high level, and the second level unit sets the level of the first shifted output signal to a low level.

9. The shift register apparatus as claimed in claim 8, wherein the first level unit is a P-type transistor comprising a gate receiving the second control signal, a source receiving a high reference level and a drain coupled to the first switch, and
   wherein the second level unit is a N-type transistor comprising a gate receiving the first control signal, a source receiving a low reference level, and a drain coupled to the second switch.

10. The shift register apparatus as claimed in claim 9, wherein the first transistor is a N-type transistor, the second transistor is a P-type transistor, the second logic gate is a NAND gate, the third logic gate is a NOT gate, at least one of the first and the second switches is a transmission gate, an N-type transistor or a P-type transistor, the first level unit sets the level of the first setting signal to a low level, and the second level unit sets the level of the first shifted output signal to a high level.

11. The shift register apparatus as claimed in claim 10, wherein the first level unit is an N-type transistor comprising a gate receiving the second control signal, a source receiving a low reference level and a drain coupled to the first switch, and
   wherein the second level unit is a P-type transistor comprising a gate receiving the first control signal, a source coupled to the second switch and a drain receiving a high reference level.

12. The shift register apparatus as claimed in claim 1, wherein the shift register further comprises
   a second shift register cell comprising:
      a second logic unit generating a third control signal and a fourth control signal according to the first shifted output signal and a second setting signal;
      a second control unit according to the third and fourth control signals to make the second clock update the second setting signal during a third period; and
      a second output unit outputting a second shifted output signal, wherein the second output unit employs the third and fourth control signals to make a first clock signal to update the second shifted output signal during the third period, and the second output unit controls the second shifted output signal according to the third and fourth control signals during a fourth period such that the second shifted output signal does not follow the first clock signal.

13. A display system, comprising:
a display panel comprising:
- a plurality of pixels;
- a gate driver comprising the shift register apparatus as claimed in claim 1 to generate a plurality of gate signals to the pixels;
- a data driver generating a plurality of data signals to the pixels; and
- an input unit coupled to the display panel to provide an input signal to the display panel such that the display panel displays an image.

14. The display system as claimed in claim 13, wherein the display system is a tablet personal computer, a projector, an electronic book, a notebook computer (NB), a cellular phone, a digital camera (DSC), a personal digital assistant (PDA), a personal computer (PC), a television, a car display, or a mobile DVD player.

* * * * *